(12) United States Patent
Parikh

(10) Patent No.: US 8,806,388 B2
(45) Date of Patent: Aug. 12, 2014

(54) EXTRACTION OF IMAGING PARAMETERS FOR COMPUTATIONAL LITHOGRAPHY USING A DATA WEIGHTING ALGORITHM

(71) Applicant: Texas Instruments Incorporated, Dallas, TX (US)

(72) Inventor: Ashesh Parikh, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/849,227

(22) Filed: Mar. 22, 2013

(65) Prior Publication Data

US 2013/0254724 A1    Sep. 26, 2013

Related U.S. Application Data

(60) Provisional application No. 61/614,935, filed on Mar. 23, 2012.

(51) Int. Cl.
*G06F 17/50* (2006.01)
*G03F 7/20* (2006.01)
*G03F 1/36* (2012.01)

(52) U.S. Cl.
CPC ............ *G03F 17/50* (2013.01); *G03F 7/70625* (2013.01); *G03F 7/70516* (2013.01); *G03F 1/36* (2013.01); *G03F 7/705* (2013.01); *G03F 7/70641* (2013.01)
USPC .................................. 716/51; 716/53; 716/54

(58) Field of Classification Search
USPC ........................................................ 716/53
See application file for complete search history.

(56) References Cited

U.S. PATENT DOCUMENTS

| 7,652,758 | B2 | 1/2010 | Park et al. | |
|---|---|---|---|---|
| 2011/0224956 | A1* | 9/2011 | Ye et al. | 703/1 |
| 2012/0117522 | A1* | 5/2012 | Feng et al. | 716/54 |

OTHER PUBLICATIONS

Candes, Emmanuel and Michael Wakin, "An Introduction to Compressive Sampling", IEEE Signal Processing Magazine, 25(2), pp. 21-30, Mar. 2008.*
Youping Zhang, et al., "A Focus Exposure Matrix Model for Full Chip Lithography Manufacturability Check and Optical Proximity Correction", SPIE Proceedings, vol. 6283, Published May 3, 2006.

* cited by examiner

*Primary Examiner* — Paul Dinh
*Assistant Examiner* — Bryce Aisaka
(74) *Attorney, Agent, or Firm* — Eugene C. Conser; Frederick J. Telecky, Jr.

(57) ABSTRACT

A method of computational lithography includes collecting a critical dimension (CD) data set including CD data from printing a test structure including a set of gratings which provide a plurality of feature types including different ratios of line width to space width, where the printing includes a range of different focus values. The CD data is weighted to form a weighted CD data set using a weighting algorithm (WA) that assigns cost weights to the CD data based its feature type and its magnitude of CD variation with respect to a CD value for its feature type at a nominal focus (nominal CD). The WA algorithm reduces a value of the cost weight as the magnitude of variation increases. At least one imaging parameter is extracted from the weighted CD data set. A computational lithography model is automatically calibrated using the imaging parameter(s).

11 Claims, 5 Drawing Sheets

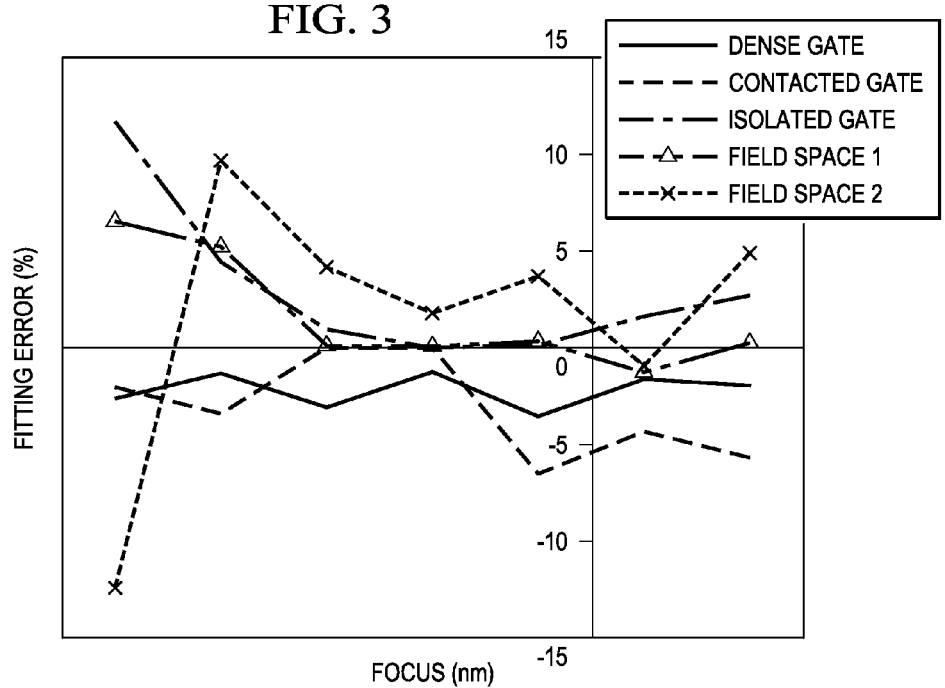
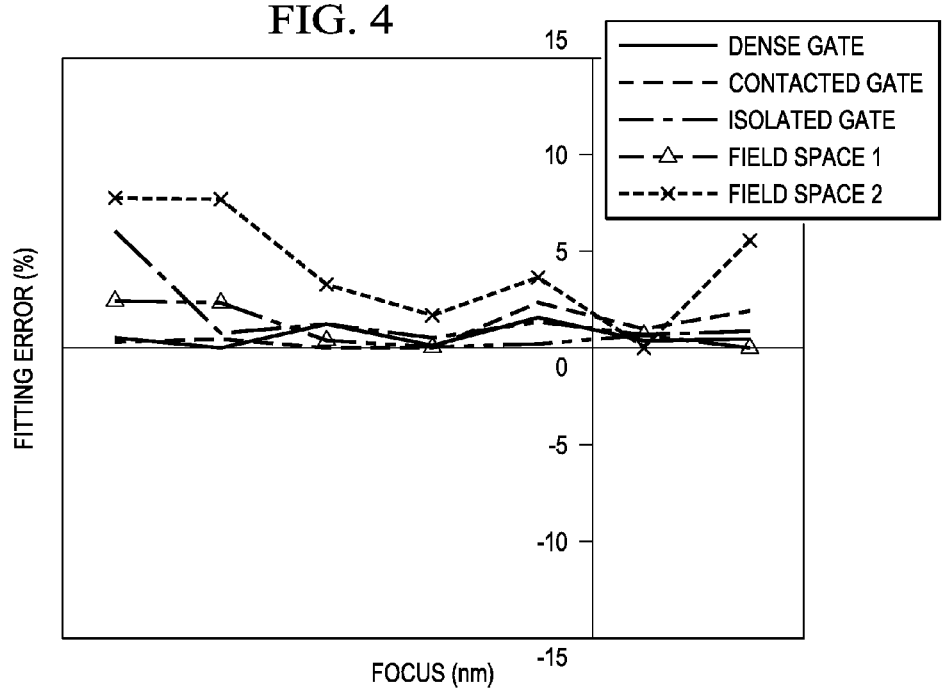

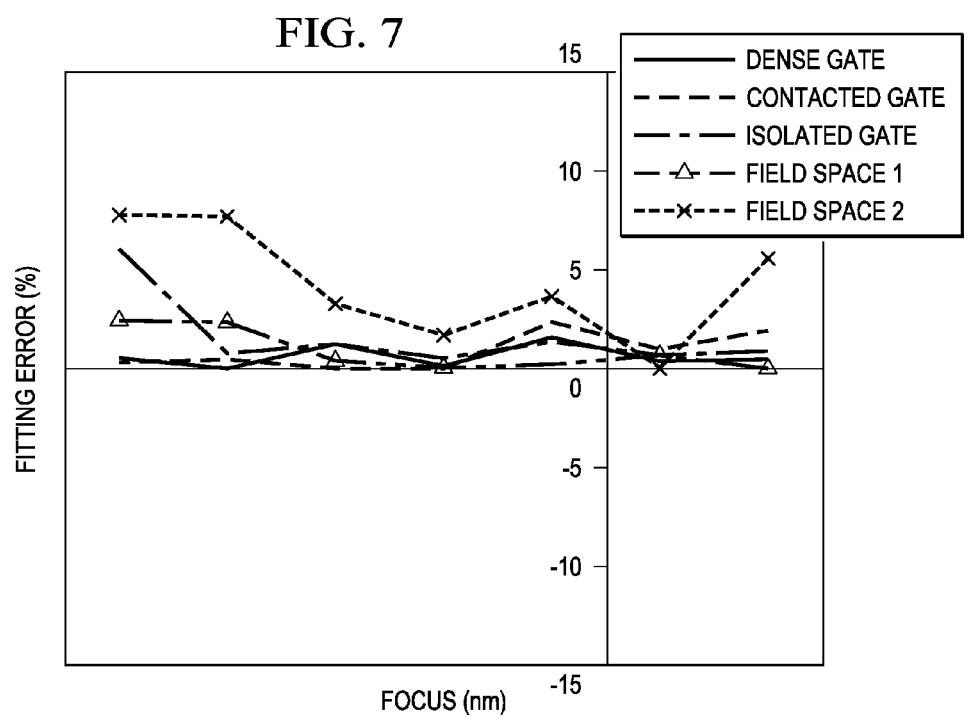

US 8,806,388 B2

EXTRACTION OF IMAGING PARAMETERS FOR COMPUTATIONAL LITHOGRAPHY USING A DATA WEIGHTING ALGORITHM

CROSS REFERENCE TO RELATED APPLICATIONS

This application claims the benefit of Provisional Application Ser. No. 61/614,935 entitled "APPARATUS FOR RAPID EXTRACTION OF IMAGING PARAMETERS FOR COMPUTATIONAL LITHOGRAPHY", filed Mar. 23, 2012, which is herein incorporated by reference in its entirety.

FIELD

Disclosed embodiments relate to integrated circuits (ICs) including semiconductor fabrication, and more particularly to computational lithography for forming IC devices and IC devices therefrom.

BACKGROUND

Lithographic projection apparatus (lithography tools) can be used, for example, in the manufacture of ICs. When using the various lithography tools, a mask (or reticle) can be used that contains a circuit pattern corresponding to an individual layer of the IC, and this pattern, usually having many designs, can be imaged onto a target portion (e.g., comprising one or more dies) on a substrate, such as a silicon wafer or other wafer comprising a semiconductor surface, that has been coated with a layer of radiation-sensitive material, such as a resist. In general, a single wafer may contain a network of adjacent target portions that can be successively irradiated using a projection system of the tool, one at a time.

One of the goals in IC fabrication is to faithfully reproduce the original IC design on the wafer using the mask. Another goal is to use as much of the wafer area as possible. As the size of an IC is reduced and its feature density increased, however, the critical dimension (CD) of its corresponding mask (or reticle) approaches the resolution limit of the optical exposure tool. The resolution for an exposure tool can be defined as the minimum feature sizes that the exposure tool can repeatedly expose on the wafer. The resolution value of exposure tools often constrains the minimum CD possible for advanced IC designs.

Traditionally, models required for computational lithography which generate imaging parameters for lithography tools are collected inline (empirical) to provide an extensive dataset from one selected (or "golden") lithography tool until the root mean squared (RMS) error for the imaging parameters are minimized. The corrected mask/reticle derived from the golden lithography tool is utilized for any tool in the fab, or across another fab. Since about the 130 nm process node, the mask/reticle derived using this methodology is progressively unable to be patterned across different tools with high process yield. The same mask/reticle exhibits process yield problems even for the golden lithography tool after some preventative maintenance. ICs manufactured using sub-wavelength lithography are thus subject to high CD variability (reflecting in a large variance ($\sigma$)), due to imaging tool differences. This situation can cause either device yield loss or require extensive modification of imaging conditions by each tool and associated modification cost at setup to reduce CD variability.

SUMMARY

Disclosed embodiments recognize current methodologies which minimize the computational lithography (CL) model fit to inline (empirical) data sets from one "golden" lithography tool ensures that there will be a mismatch on the other lithography tools in the semiconductor factory (fab). Furthermore, the conventional desire to minimize the root mean square (RMS) error for all CD data points obtained results in "over-fit" models where the error (variance relative to a nominal CD value) from the nosiest CD data-points can dominate, resulting in a less physical optical proximity correction (OPC) for the computational lithography model resulting in high variability ($\sigma$) in CD's due to imaging tool differences. Integrated circuits (ICs) manufactured using conventional sub-wavelength lithography are thus subject to high variability ($\sigma$) of CD's due to imaging tool differences.

Disclosed embodiments use gratings having features at different ratios of line width to space width (frequency/spacing) to generate inline CD data at a plurality of different focuses, including off-focus values. Depending on the imaging tool capability (lens resolution, for example), the patterning performance of these features will be dependent. The data obtained is cost weighted (or scaled) by a disclosed weighting algorithm (WA) that assigns cost weights to the CD data, such as weights that are inversely proportional to the variance ($\sigma$) of the respective CD data measured from a nominal CD value for its feature type.

Advantages of disclosed embodiments include simplicity. Use of gratings at different ratios of line width to space width and measuring CD performance with defocus for a few focus sensitive feature types significantly reduces the data collection and intrusiveness. Moreover the cost weighted data can be used to calibrate the lithography model to the process median.

BRIEF DESCRIPTION OF THE DRAWINGS

Reference will now be made to the accompanying drawings, which are not necessarily drawn to scale, wherein:

FIG. 3 shows fitting error (%) as a function of focus (nm), where the model is a conventional model calibrated with equal CD data weighting.

FIG. 4 shows fitting error with focus, where the model is calibrated with CD data that is weighted using a disclosed WA, according to an example embodiment.

FIG. 7 shows a reduction in through-focus fitting error with the introduction of a focus-blur parameter, according to an example embodiment.

DETAILED DESCRIPTION

Figure 1:
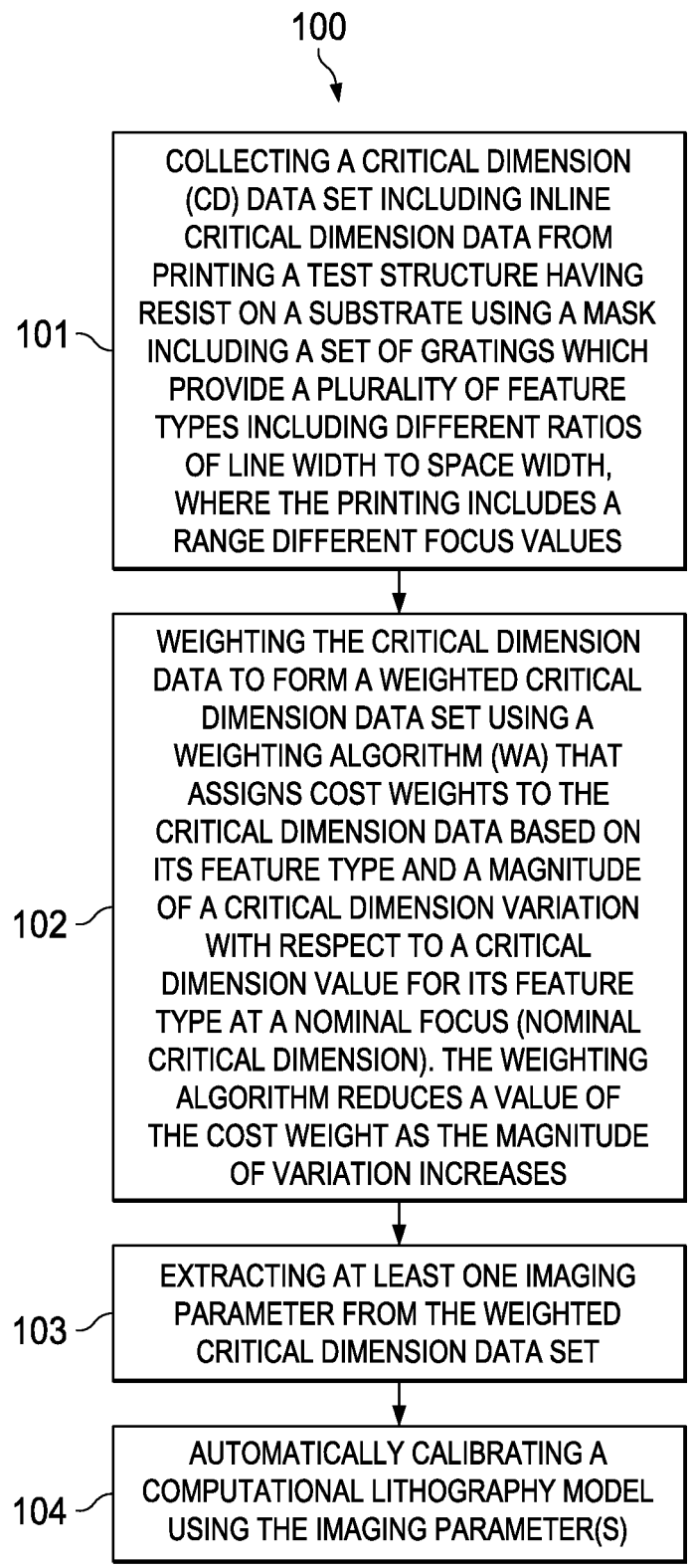
FIG. 1 is a flow chart that shows steps in an example method of computational lithographing including extraction of imaging parameters for computational lithography using a disclosed data weighting algorithm, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 of computational lithographing including extraction of imaging parameters for computational lithography using a data weighting algorithm, according to an example embodiment. Step 101 comprises collecting a CD data set including inline (empirical) CD data from printing a test structure having resist on a substrate using a mask including a set of gratings (lines or spaces) which provide a plurality of feature types including different ratios of line width to space width (frequency/spacing), where the printing includes a range different focus values. This data collection allows construction of Bossung curves for each of the feature types. The artisan with ordinary skill in the art will appreciate that the term "mask" and "reticle", should be considered to be equivalent. The CD data is generally inline post-develop resist data, but may also be zero bias etch data.

Step 102 comprises weighting the CD data to form a weighted CD data set using a weighting algorithm (WA) that assigns cost weights to the CD data based its feature type and a magnitude of its CD variation with respect to a CD value for its feature type obtained at a nominal focus (nominal CD). As used herein, "feature type" refers to the ratio of line width to space width in a given pattern portion (from a grating having repetitive lines and spaces on a reticle) of a lithography level, with each different feature type having a different ratio of line width to space width. Different feature types thus provide different pattern densities with resulting different optical interference effects. Different feature types may provide different pitches, defined in the art as the period of the grating.

The WA algorithm reduces a value of the cost weight of the discrete CD data as the magnitude of its CD variation increases relative to a nominal CD. In one embodiment the WA is an inverse weight algorithm (IWA), where the IWA algorithm assigns cost weights to the CD data as an inverse proportion to the magnitude of their variation measured relative to the nominal CD value for its feature type.

In one particular embodiment the cost weight for CD data associated with a particular feature type is given by:

$$\text{Cost Wt} = \frac{CD @ 3\sigma \text{ Focus}}{CD @ \text{Nominal Focus}}$$

Step 103 comprises extracting at least one imaging parameter from weighted CD data set. The weighted CD data set obtained from the CD data weighting provided by step 102 improves the signal to noise ratio (SNR) of the weighted CD data set. The weighted CD data set may be optionally sampled (e.g., a random sample, so that only a portion of the weighted CD data set is used, such as about 20% of the CD data in one particular embodiment), or be based on design rules, before extracting the image parameter(s). The entire weighted CD data set may also be used.

The imaging parameter extracted can include a plurality of imaging parameters including two or more of a dipole center sigma, focus blur, source shape, numerical aperture (NA) and lens aberration. Focus blur nominally refers to deviation from ideal image due to finite laser band-width, vertical mechanical vibration and/or reticle wafer stage tilt. By using data sampling or by obtaining less CD data in the first place, the portion of the weighted CD data set used to extract the imaging parameter(s) in step 103 can be a reduced data set that is below a minimum number set by a sampling criterion defined by Nyquist-Shannon.

Step 104 comprises automatically calibrating a computational lithography model using the imaging parameter(s). Computational lithography can be performed using the computational lithography model to design a reticle for at least one level for fabricating an integrated circuit (IC). Due to disclosed computational lithography models being more physical (i.e., less empirical) as compared to conventional computational lithography models, disclosed computational lithography models can be utilized without modification for a variety of different lithography tools, typically including lithography tools of the same model (same nominal laser source and optics) even though one or more of the lithography tools may not contributing any of the CD data used to generate the computational lithography model.

In one particular application for disclosed extraction of imaging parameters for computational lithography using a data weighting algorithm, models were calibrated by adjusting the imaging as well as the empirical parameters on a process window (PW) data-set that was collected post develop resist by a scanning election microscope (SEM) from a low-k 130 nm gate lithography process. Parameters were extracted on the identical data-set with and without statistical data weighting using a disclosed IWA. Using the disclosed IWA cost weight scaling technique, the through focus fitting error was found to be reduced by 50% from +/−5% when calibrated over the whole unscaled CD data-set to about 2% even with a disclosed truncated data set.

Regarding theoretical aspects of disclosed model calibration, improved accuracy of models is provided by disclosed embodiments by extracting optical parameters that more accurately reflect the physics of imaging, and combining them with empirical resist models that reasonably represent the resist process. Another benefit of this disclosed methodology is the creation of a resist model that is portable to a different imaging condition beyond the one from where the empirical data was collected. Accomplishing this by improving the cycle-time for model calibration and reduction in the required data volume for fitting would be even more useful in terms of resource productivity. As described above, sparse sampling methodology can be utilized which uses a reduced number of data points to reconstruct an image even though the number of data points would be deemed insufficient under the Nyquist-Shannon criteria.

Disclosed embodiments recognize the structure behind an undetermined system many include coefficients whose values are close to or equal to zero. This realization provides a guiding principle behind disclosed embodiments. First, there exists a well defined structure behind the trends that computational lithography is trying to model, i.e. the signals are very well governed by the physics of partially coherent imaging. Second, within the empirical data set lie data points that are inherently noisier than others, for instance based on the respective feature type's sensitivity to focus variations. Finally, all data points include varying degree of noise emanating from the metrology technique used. All computational lithography simulators generally extract parameters by regression where a cost function, usually the root mean square (RMS) error, is minimized. However, this method is in conflict with the goal to accurately extract physical parameters wherein the simulator is likely to fit a model by tuning parameters that may have no lithographic meaning. An important disclosed aspect that improves model accuracy is to detect points that are not part of a trend. By having disclosed methods reducing the weight of data points that are not part of a trend relative to the rest of the data, then the simulator can converge to a solution using parameters closer to their actual physical values.

EXAMPLES

Disclosed embodiments are further illustrated by the following specific Examples, which should not be construed as limiting the scope or content of this Disclosure in any way.

A 1-dimensional empirical CD data-set was collected by inline metrology SEM using a single measurement threshold from a 130 nm gate (electrode) process. Input data included features of varying ratios of line width to space width, including different pitch values. Through-focus data from several different feature types was also included in the calibration data matrix. The imaging parameters were generally selected such that the dense gate and contacted gates feature types had a large depth of focus and therefore are insensitive to focus variations. In contrast, the isolated gates and field space of various sizes feature types are more sensitive to focus. In all cases at far from best-focus conditions, a significant increase in CD data-error due to deteriorating resist profile and metrology was seen.

To overcome the challenge of noisy metrology, curve fitting techniques can be used to extract weight assignments for discrete CD data associated with a feature type measured at different focus conditions. A similar method was used to extract weights for through focus data, with the points away from the best focus (best focus=nominal focus referred to above) were assigned a proportionally lower weighting. Similarly, different exposure conditions can be optionally added for the different focus conditions.

Figure 2A:
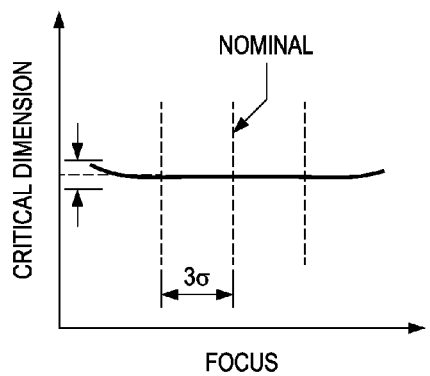
FIGS. 2A and 2B show CD variation with focus for a first and a second feature type, respectively, according to an example embodiment.
Figure 2B:
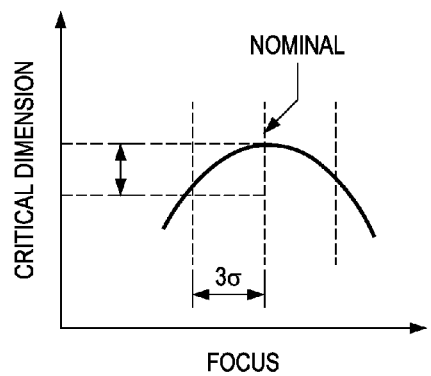

FIGS. 2A and 2B illustrate CD variation as a function of focus for first and second feature types, respectively. Feature types such as dense lines have large depth of focus (DOF) and exhibit negligible CD variation across the focus budget (small 3σ shown), as illustrated in FIG. 2A. As illustrated in FIG. 2B, other feature types such as isolated lines can be sensitive to focus and show very large CD variation (large 3σ shown), along the same focus budget. It is recognized that the errors in CD measurements will vary depending on feature spacing. An analytical method to calculate the probability density function for a given feature with focus and exposure has been described previously (see Mack, C. A., "Depth of focus, Part 2," Microlithography World Autum, 23-24 (1995). A modified version of that equation was initially used, where the ratios of feature CD with defocus were calculated.

This was further simplified by taking an inverse ratio of feature CD at best (nominal) focus and at the budgeted 3σ off-focus condition, and normalizing it to the control feature. The cost weight extracted in this manner would, for the focus insensitive feature type be equal to 1, while for a highly focus sensitive feature type a fraction of 1 (i.e. <1).

Figure 2C:
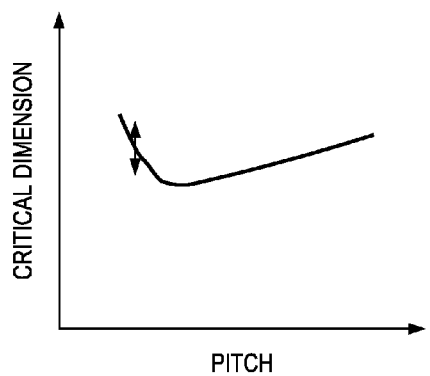
FIGS. 2C and 2D show CD variation evidencing data error as a function of feature pitch, according to an example embodiment.
Figure 2D:
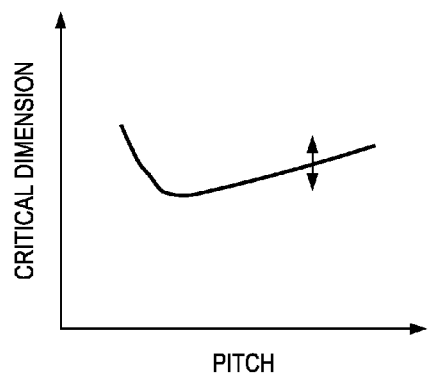

In addition to PW data, the data at best focus and dose for features spaced at different pitch were also weighted. In lithography, usually a focus budget for each pattern level is assigned depending on the imaging tool capability and design requirement. FIGS. 2C and 2D illustrate CD error as a function of pitch.

Regarding calibration results, all model calibration was performed on a single PW data-set. In the initial run, only the illumination parameters related to focus and sigma (σ) were allowed to be tuned. In all cases, a fixed range of the resist parameter coefficients was used for regression. No attempt was made to change that portion of the lithography model. Initially, all the CD data points were weighted equally.

FIG. 3 shows the through-focus fitting errors for various feature types after regression without any disclosed data weighting. For FIG. 3 (as well as FIGS. 4, 6 and 7 described below) the ratio of line width to space width for the feature types shown as "Dense Gate" were Line 1 (unit) and Space 1.33 (unit), "Contacted Gate" Line 1 and Space 2, "Isolated Gate" Line 1 and Space 10, and "Field Space 1" and "Field Space 2" with Line 10 and Space 1 with the difference between Field Space 2 and Field Space 1 is the space being graded by different increments.

While the net fitting error appears to be centered about 0%, the through-focus error even for feature types such as dense gate and contacted gate can be seen to lie well beyond 5% with several points at the focus extremities showing a fitting error beyond 10%. Generally, a lithography model calibrated with this range of fitting error would be deemed unacceptable and require further tuning.

The same data-set was weighted using a disclosed IWA. FIG. 4 shows the through-focus fitting errors after regression using identical fitting parameter range, now with the modified cost weighting for the CD data provided by the IWA. Through focus fitting error can be seen to have improved significantly, with fitting errors falling within 2% for most of the feature types. It also appeared that the imaging parameters extracted by the cost weighted regression were closer to the tool setting, and therefore with less of an empirical component to that model.

To test this hypothesis, the data-set at best focus and dose was truncated by 50% by removing several drawn line sizes. Parameters were regressed over the identical range as in previous runs. The concept was that if the extracted model parameters were close to the physical parameters of imaging system, then the model output should be invariant with the input data size. Delta model CD's for the minimum feature line extracted using the full and truncated data-set respectively were compared.

Figure 5:
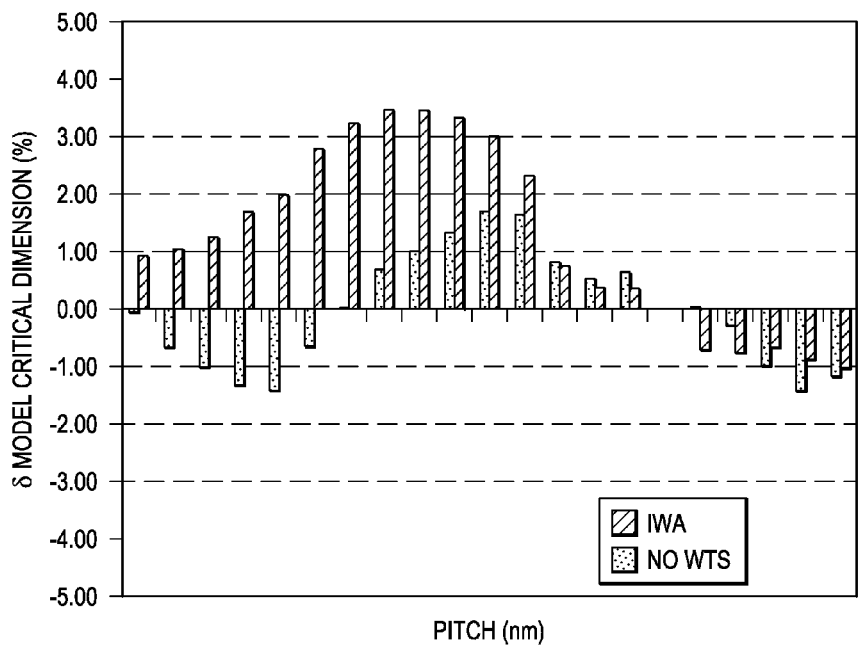
FIG. 5 shows delta model CD (%) deviation data for minimum sized lines with a full and truncated data-set with conventional no weights and disclosed weighting with an IWA, according to an example embodiment.

FIG. 5 shows % delta for models with conventional equal data weighting (shown as "NO WTS") and models weighted using a disclosed IWA (IWA), respectively. For the model calibrated with conventional equal weighting, the delta model CD's ranged from −1% to 3.5%. This difference is very high suggesting that the simulator minimized the RMS error using a significant degree of empirical components. Using a disclosed IWA, the range of model CD delta was reduced in comparison by 50%. This appears to be a clear indication that the empirical fitting kernels were dominating the conventional lithography model which used equal conventional CD data weighting. With disclosed CD data weighting, the simulator was able to extract a more physical model reflecting resulting in a reduction in delta model CD's.

Figure 6:
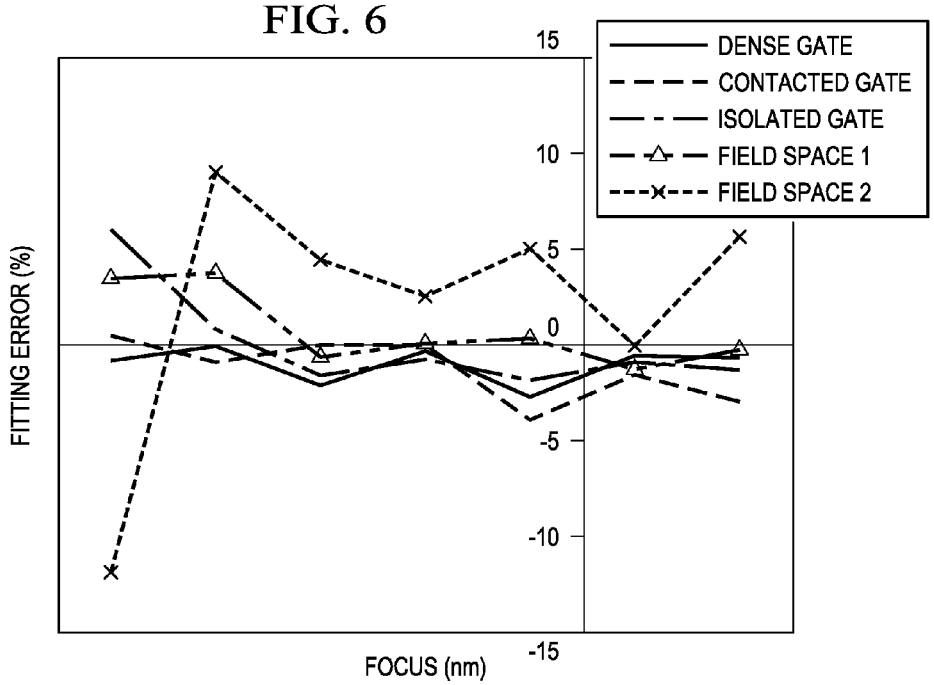
FIG. 6 shows fitting error (%) with focus data, model calibrated using truncated data-set scaled using an IWA, according to an example embodiment.

Additional parameter extraction was explored using only the truncated data-set scaled using a disclosed IWA. FIG. 6 shows through focus fitting errors for the model that was calibrated using focus, sigma and resist empirical parameters. In FIG. 7, an additional parameter relating to image blur was allowed to be regressed. Errors of +/−12% seen in FIG. 6 at the extremities of the focus range can be seen to be reduced to less than 5%. Model CD delta test, similar to what was described in FIG. 4, showed no change evidencing the model was closely governed by the physical parameters. As a final note, the remaining fitting errors lie at the extremities of the focus range and for very marginal features. Under the definition of IWA, these points are weighted very low due to their inherent lack of process margin and therefore the simulator does not correct this error.

Concluding, using a PW data-set, using known algorithms, calibrated lithography models with significant empirical kernels that do not accurately reflect the imaging conditions are likely to be generated. Using a subset of the same data-set, now with disclosed cost weights applied to the discrete CD data using a disclosed algorithm such as a disclosed IWA, a lithography model was calibrated that not only lowered the through-focus fitting error by over 50% from about +/−5% to about +/−2% but also extracted imaging parameters similar to the actual process conditions used. The use of scaled PW data also enabled evaluation of additional imaging terms such as focus blur and its impact across off-focus conditions. The ability to accurately extract imaging parameters with a smaller size input data-set has enabled significant improvement in the model creation cycle-time across several nodes ranging from 180 nm to 65 nm. Moreover, the process of extracting disclosed weights for CD data is completely analytical and therefore conducive to automation. Since no active engineering intervention was required with this methodology, the process of model creation can be automated.

Disclosed embodiments can be used for a variety of lithography systems to form semiconductor devices that may include various elements therein and/or layers thereon, including barrier layers, dielectric layers, device structures, active elements and passive elements including source regions, drain regions, bit lines, bases, emitters, collectors, conductive lines, conductive vias, etc. Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of computational lithography, comprising:
    collecting an inline critical dimension (CD) data set including CD data obtained from printing a test structure having resist on a substrate using a mask including a set of gratings which provides a plurality of feature types including different ratios of line width to space width, said printing including a range of different focus values;
    weighting said CD data, using a computing device, to form a weighted CD data set using a weighting algorithm (WA) that assigns cost weights to said CD data based on a feature type of said plurality of feature types and a magnitude of a variation of its CD value with respect to a CD value for said feature type at a nominal focus (nominal CD), said WA algorithm reducing a value of said cost weight as said magnitude of said variation increases;
    extracting at least one imaging parameter, using said computing device, from said weighted CD data set, and
    using said computing device, automatically calibrating a computational lithography model using said imaging parameter; wherein said WA is an inverse weight algorithm (IWA), said IWA algorithm assigning said cost weights as an inverse proportion to said magnitude of said variation.

2. The method of claim 1, wherein said imaging parameter includes a plurality of imaging parameters including two or more of a dipole center sigma, focus blur, source shape, numerical aperture (NA) and lens aberration.

3. The method of claim 1, wherein said weighted CD data set is a reduced data set that is below a minimum number set by a sampling criterion defined by Nyquist-Shannon.

4. The method of claim 1, wherein said printing further comprises using different exposure conditions for said range of different focus values.

5. The method of claim 1, further comprising performing computational lithography using said computational lithography model to design a reticle for at least one level for fabricating an integrated circuit (IC).

6. The method of claim 1, further comprising utilizing said computational lithography model without modification for a variety of different lithography tools including at least one lithography tool not contributing any of said CD data.

7. A computer program product, comprising:
    executable code transportable by a non-transitory machine readable medium, wherein execution of said code by at least one programmable computer causes said programmable computer to perform a sequence of steps for a computational lithography process for a lithography system, said sequence of steps comprising:
    weighting data obtained from an inline critical dimension (CD) data set including CD data obtained from printing a test structure having resist on a substrate using a mask including a set of gratings which provides a plurality of feature types including different ratios of line width to space width, said printing including a range of different focus values,
    wherein said weighting uses a weighting algorithm (WA) that assigns cost weights to said CD data based on a feature type of said plurality of feature types and a magnitude of a variation of its CD value with respect to a CD value for said feature type at a nominal focus (nominal CD), said WA algorithm reducing a value of said cost weight as said magnitude of said variation increases;
    extracting at least one imaging parameter from a weighted CD data set, and
    automatically calibrating a computational lithography model using said imaging parameter; wherein said WA is an inverse weight algorithm (IWA), said IWA algorithm assigning said cost weights as an inverse proportion to said magnitude of said variation.

8. The computer program product of claim 7, wherein said imaging parameter includes a plurality of imaging parameters including two or more of a dipole center sigma, focus blur, source shape, numerical aperture (NA) and lens aberration.

9. The computer program product of claim 7, wherein said weighted CD data set is a reduced data set that is below a minimum number set by a sampling criterion defined by Nyquist-Shannon.

10. The computer program product of claim 7, wherein said printing further comprises using different exposure conditions for said range of different focus values.

11. The computer program product of claim 7, wherein said computational lithography model is operable to place and verify assist features in a reticle for at least one level for an integrated circuit (IC) design.

* * * * *